(12) United States Patent
Ogura

(10) Patent No.: US 9,491,893 B2
(45) Date of Patent: Nov. 8, 2016

(54) DISPLAY DEVICE

(71) Applicant: Funai Electric Co., Ltd., Osaka (JP)

(72) Inventor: Kenji Ogura, Osaka (JP)

(73) Assignee: Funai Electric Co., Ltd., Osaka (JP)

( * ) Notice: Subject to any disclaimer, the term of this patent is extended or adjusted under 35 U.S.C. 154(b) by 171 days.

(21) Appl. No.: 14/284,055

(22) Filed: May 21, 2014

(65) Prior Publication Data
US 2014/0347816 A1 Nov. 27, 2014

(30) Foreign Application Priority Data

May 24, 2013 (JP) ................................ 2013-110329

(51) Int. Cl.
| G06F 1/16 | (2006.01) |
|---|---|
| H05K 5/00 | (2006.01) |
| H05K 7/20 | (2006.01) |
| H04N 5/64 | (2006.01) |
| G06F 1/20 | (2006.01) |

(52) U.S. Cl.
CPC ......... H05K 7/20954 (2013.01); G06F 1/1601 (2013.01); G06F 1/20 (2013.01); H04N 5/64 (2013.01); H05K 5/0017 (2013.01)

(58) Field of Classification Search
CPC .................. G06F 1/16; G06F 1/1601–1/1611; G06F 1/1613–1/1698; G06F 1/18–1/189; H05K 5/00–5/069; H05K 7/00–7/186; H05K 7/20218–7/20381; H05K 7/20409–7/20418; H05K 7/20009–7/202; H01L 23/367–23/3677; H01L 23/473; H01L 23/46–23/467; H01L 33/64
USPC ............. 361/679.01–679.45, 679.55–679.61, 361/676–678, 679.46–679.54, 688–727, 361/756, 741, 686, 687, 787, 789, 794, 361/807–810; 165/80.1–80.5, 104.33, 185; 174/15.1–15.3, 16.1–16.3, 547, 548; 257/712–722, E23.088; 24/453, 24/458–459; 454/184; 312/236; 349/56–60; 348/787, 789, 794
See application file for complete search history.

(56) References Cited

U.S. PATENT DOCUMENTS

| 6,532,152 | B1 | 3/2003 | White et al. |
|---|---|---|---|
| 7,157,838 | B2 | 1/2007 | Thielemans et al. |
| 7,259,964 | B2 | 8/2007 | Yamamura et al. |
| 8,248,780 | B2 | 8/2012 | Zheng et al. |
| 2003/0090870 | A1* | 5/2003 | Kuo .......................... G06F 1/16 361/679.54 |
| 2004/0027073 | A1* | 2/2004 | Nomoto ................... H05K 5/02 313/583 |
| 2004/0116065 | A1* | 6/2004 | Oh ...................... H05K 7/20172 454/184 |
| 2004/0135482 | A1 | 7/2004 | Thielemans et al. |

(Continued)

FOREIGN PATENT DOCUMENTS

| EP | 1420327 A1 | 5/2005 |
|---|---|---|
| JP | H09-274444 A | 10/1997 |

OTHER PUBLICATIONS

European Search Report issued in European Application No. 14168664.2 mailed Aug. 4, 2014 (5 pages).

Primary Examiner — Anthony Haughton
Assistant Examiner — Razmeen Gafur
(74) Attorney, Agent, or Firm — Osha Liang LLP

(57) ABSTRACT

A display device, comprising a display panel, a back surface enclosure disposed on a back surface side of the display panel and comprising a concave portion formed in a concave shape on a display panel side, and a heat generating component disposed between the display panel and the back surface enclosure, wherein the concave portion comprises a plurality of holes that release heat from the heat generating component to an outside of the display device.

20 Claims, 9 Drawing Sheets

(56) References Cited

U.S. PATENT DOCUMENTS

| | | | |
|---|---|---|---|
| 2005/0105012 A1* | 5/2005 | Kim | G02F 1/133308 349/58 |
| 2005/0258749 A1* | 11/2005 | Ahn | H05K 7/20963 313/582 |
| 2006/0070280 A1 | 4/2006 | Yamamura et al. | |
| 2006/0119242 A1* | 6/2006 | Kang | H05K 7/20009 313/46 |
| 2006/0132669 A1* | 6/2006 | Liou | G02F 1/133308 349/58 |
| 2006/0203143 A1* | 9/2006 | Shin | G02F 1/133382 349/58 |
| 2006/0221564 A1* | 10/2006 | Kim | H04N 5/64 361/679.61 |
| 2007/0146981 A1* | 6/2007 | Titzler | G06F 1/1601 361/679.22 |
| 2007/0206123 A1* | 9/2007 | Hsieh | H04N 5/64 348/794 |
| 2007/0230120 A1* | 10/2007 | Hata | G06F 1/1616 361/690 |
| 2008/0285222 A1* | 11/2008 | Yeo | H05K 9/0022 361/679.46 |
| 2008/0298003 A1* | 12/2008 | Pyo | G06F 1/1601 361/679.02 |
| 2009/0122218 A1* | 5/2009 | Oh | G02F 1/133385 361/679.21 |
| 2009/0185341 A1* | 7/2009 | Jang | F16M 11/041 361/679.22 |
| 2010/0073582 A1* | 3/2010 | Konno | G02F 1/133308 348/794 |
| 2010/0171889 A1 | 7/2010 | Pantel et al. | |
| 2010/0177479 A1* | 7/2010 | Itazawa | H05K 7/20963 361/679 |
| 2010/0245280 A1* | 9/2010 | Choi | H04N 5/64 345/173 |
| 2010/0321887 A1* | 12/2010 | Kwon | H05K 7/20972 361/695 |
| 2011/0007230 A1* | 1/2011 | Yamamoto | G02F 1/133308 348/794 |
| 2011/0141671 A1* | 6/2011 | Ishizu | F16M 11/10 361/679.01 |
| 2011/0216493 A1 | 9/2011 | Zheng et al. | |
| 2011/0279974 A1* | 11/2011 | Fujiwara | G06F 1/1601 361/692 |
| 2012/0236499 A1* | 9/2012 | Murayama | H05K 7/20972 361/696 |
| 2012/0250185 A1* | 10/2012 | Ishikawa | G06F 1/1601 360/99.08 |

* cited by examiner

DISPLAY DEVICE

TECHNICAL FIELD

The present invention relates to a display device for displaying images.

BACKGROUND OF RELATED ART

A display device provided with a backlight unit that irradiates light toward a back surface of a display panel, such as, for example, a liquid crystal television receiver or the like, is known (for example, see Patent Document 1).

The display device is provided with an enclosure configured by a mutual combination of a front cabinet and a rear cabinet. The front cabinet is disposed so as to cover an outer periphery of the display panel. The rear cabinet is disposed on a back surface side of the display panel. The display panel, the backlight unit, and a power source substrate or the like for supplying power to the display panel, for example, are disposed inside the enclosure.

A plurality of holes disposed in a grid is provided on a planar portion of the rear cabinet. When power is turned on for the display device, the power source substrate or the like is energized and generates heat. Heat from the power source substrate or the like is released to an outside the display device through the plurality of holes.

Furthermore, a waterproof cover is disposed inside the enclosure. The waterproof cover is disposed so as to cover the power source substrate or the like from above. For example, when liquid from a beverage or the like spills on a top surface of the enclosure, the liquid may flow into the enclosure from the plurality of holes. In such a case, liquid is suppressed from adhering to the power source substrate or the like because the waterproof cover receives the liquid that flows into the enclosure.

RELATED ART DOCUMENTS

Patent Documents

[Patent Document 1] Japanese Unexamined Patent Application Publication No. H9-274444

As described above, because the plurality of holes is provided on the planar portion of the rear cabinet, strength of the planar portion decreases. Cracks may therefore form on the planar portion of the rear cabinet when an object strikes the rear cabinet.

Furthermore, as described above, when liquid spills on the top surface of the enclosure, the liquid may flow into the enclosure from the plurality of holes. The waterproof cover therefore needs to be disposed inside the enclosure, increasing a component count of the display device.

SUMMARY OF THE INVENTION

One or more embodiments of the present invention provide a display device that can secure strength of a back surface enclosure and suppress liquid from flowing in from a plurality of holes.

In one or more embodiments, a display device may comprise a display panel, a back surface enclosure disposed on a back surface side of the display panel, a concave portion formed in a concave shape on a display panel side, and a heat generating component disposed between the display panel and the back surface enclosure, wherein the concave portion may comprise a plurality of holes that release heat from the heat generating component to an outside of the display device.

According to one or more embodiments of the present invention, because the plurality of holes is provided on the concave portion, the heat from the heat generating component may be released to outside through the plurality of holes and strength of the back surface enclosure may be secured. Cracks may thereby be suppressed from forming in the back surface enclosure when, for example, an object strikes the back surface enclosure. Moreover, in relation to an ability to secure the strength of the back surface enclosure, the concave portion may be used as a handle. The display device may easily be carried by hooking a fingertip or the like on the concave portion and lifting the display device. Moreover, liquid may be suppressed from flowing into each of the plurality of holes when liquid from a beverage or the like spills on a top surface of the back surface enclosure because the plurality of holes is provided on the concave portion.

For example, in the display device according to one or more embodiments of the present invention, the plurality of holes may be disposed above the heat generating component in a longitudinal direction of the back surface enclosure.

According to one or more embodiments of the present invention, because the plurality of holes is disposed above the heat generating component, the heat from the heat generating component may be efficiently released to outside the display device through the plurality of holes.

For example, in the display device according to one or more embodiments of the present invention, the concave portion may comprise a release portion comprising the plurality of holes, and a guide portion that guides heat from the plurality of holes to an outside of the display device and is disposed above the release portion in a longitudinal direction of the back surface enclosure.

According to one or more embodiments of the present invention, because the concave portion has the release portion and the guide portion, the heat released from the plurality of holes is guided outside the display device along a top surface of the guide portion. The heat from the heat generating component may thereby be efficiently released outside the display device through the plurality of holes.

For example, in the display device according to one or more embodiments of the present invention, the release portion may be disposed opposite the guide portion.

According to one or more embodiments of the present invention, because the release portion is disposed opposite the guide portion, the heat released from the plurality of holes may be efficiently guided outside the display device along the top surface of the guide portion.

For example, in the display device according to one or more embodiments of the present invention, the concave portion may extend in an elongated shape in a lateral direction of the back surface enclosure, the plurality of holes may be disposed at intervals in a longitudinal direction of the concave portion, and each of the plurality of holes may extend in a direction substantially perpendicular to the longitudinal direction of the concave portion.

According to one or more embodiments of the present invention, because each of the plurality of holes extends substantially vertically relative to the longitudinal direction of the concave portion, the heat from the heat generating component may be efficiently released from the plurality of holes.

For example, in the display device according to one or more embodiments of the present invention, the guide portion may comprise a plurality of ribs on a top surface of the guide portion.

According to one or more embodiments of the present invention, because the plurality of ribs is provided on the top surface of the guide portion, the fingertip or the like is less likely to slip on the top surface of the guide portion when hooking the fingertip or the like on the guide portion. By this, the fingertip or the like may easily grip the guide portion and the display device may easily be carried and the like.

For example, in the display device according to one or more embodiments of the present invention, a grain finish may be applied to a top surface of the guide portion.

According to one or more embodiments of the present invention, because the grain finish is applied to the top surface of the guide portion, the fingertip or the like is less likely to slip on the top surface of the guide portion when hooking the fingertip or the like on the guide portion. By this, the fingertip or the like may easily grip the guide portion and the display device may easily be carried and the like.

For example, in the display device according to one or more embodiments of the present invention, the back surface enclosure may comprise a rear frame disposed on the back surface side of the display panel, and a rear cover that covers a portion of an outer surface of the rear frame, wherein the heat generating component may be disposed between the rear frame and the rear cover, and the concave portion may be provided on the rear cover.

According to one or more embodiments the present invention, the concave portion may be provided on the rear cover if the back surface enclosure has the rear frame and the rear cover.

For example, in the display device according to one or more embodiments of the present invention, a fastening member that fastens the rear cover to the rear frame may be disposed on the concave portion.

According to one or more embodiments of the present invention, because the fastening member is disposed on the concave portion, a head or the like of the fastening member is less likely to appear on an external appearance of the display device. A design of the display device may thereby be improved.

According the display device according to one or more embodiments of the present invention, strength of the back surface enclosure may be secured, and liquid may be suppressed from flowing in from the plurality of holes.

DETAILED DESCRIPTION OF EMBODIMENTS

Embodiments of the present invention will be described in detail below using drawings. Each embodiment described below illustrates a specific example of the present invention. Numerical values, shapes, materials, components, disposed positions and connection modes of the components, and the like illustrated in the embodiments below are examples and not intended to limit the present invention. The present invention is specified by the scope of patent claims. Therefore, among the components in the embodiments below, components not described in the independent claims are not necessarily required but are described for illustration purposes.

First Example

Overall Configuration of Display Device According to One or More Embodiments

Figure 1:
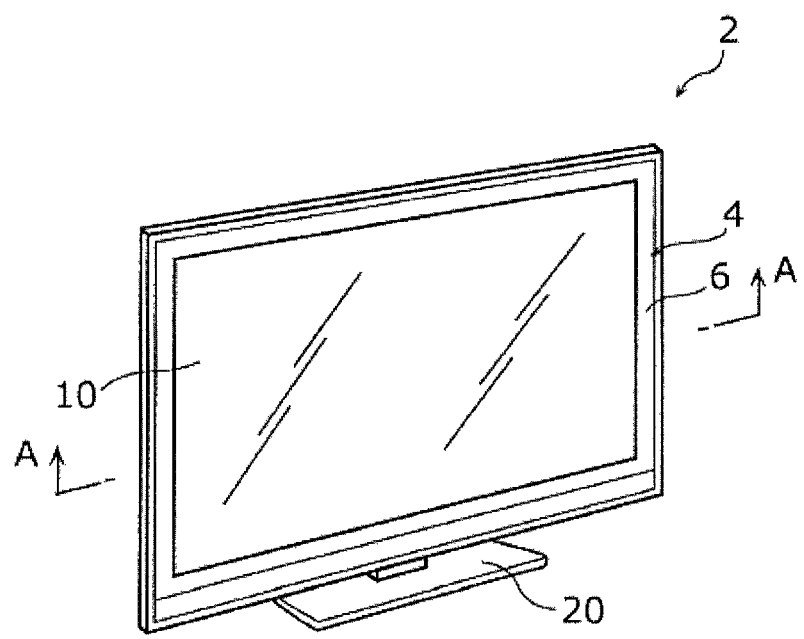
FIG. 1 is a perspective view illustrating a front surface side of a display device according to one or more embodiments of a first example of the present invention.
Figure 2:
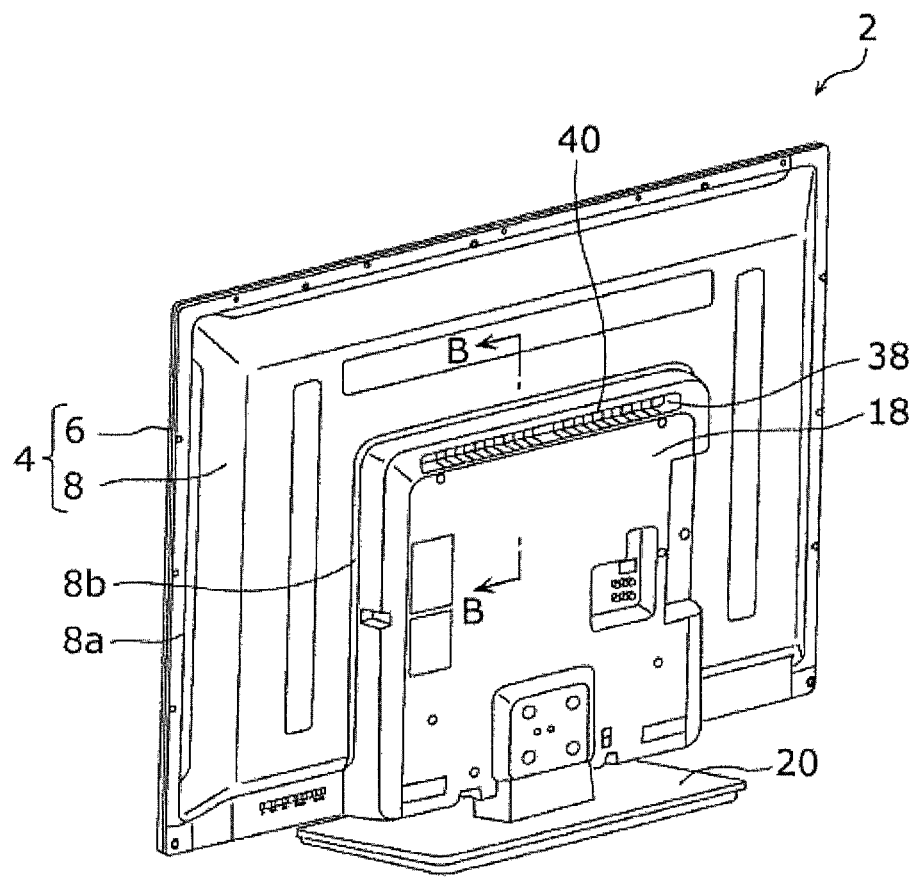
FIG. 2 is a perspective view illustrating a back surface side of the display device according to one or more embodiments of the first example of the present invention.
Figure 3:
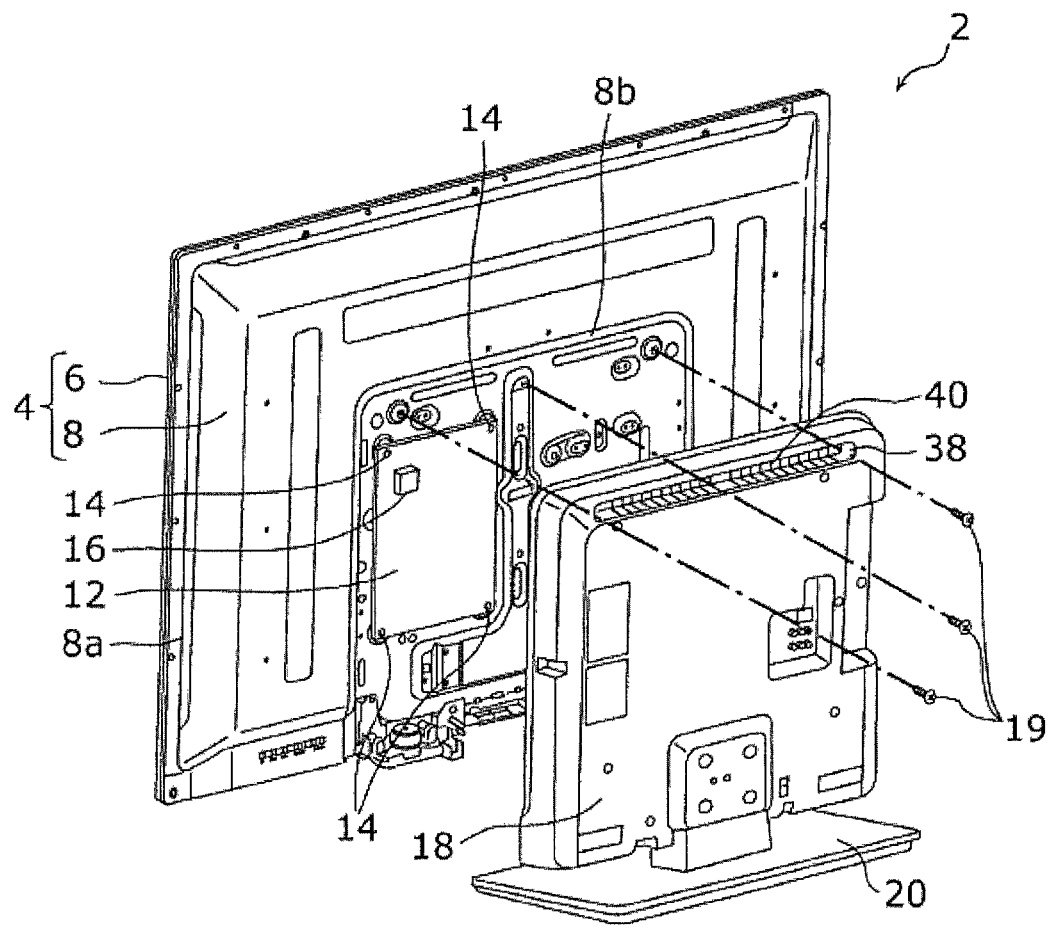
FIG. 3 is an exploded perspective view illustrating the back surface side of the display device according to one or more embodiments of the first example of the present invention in a state where a rear cover is removed from a rear frame.
Figure 4:
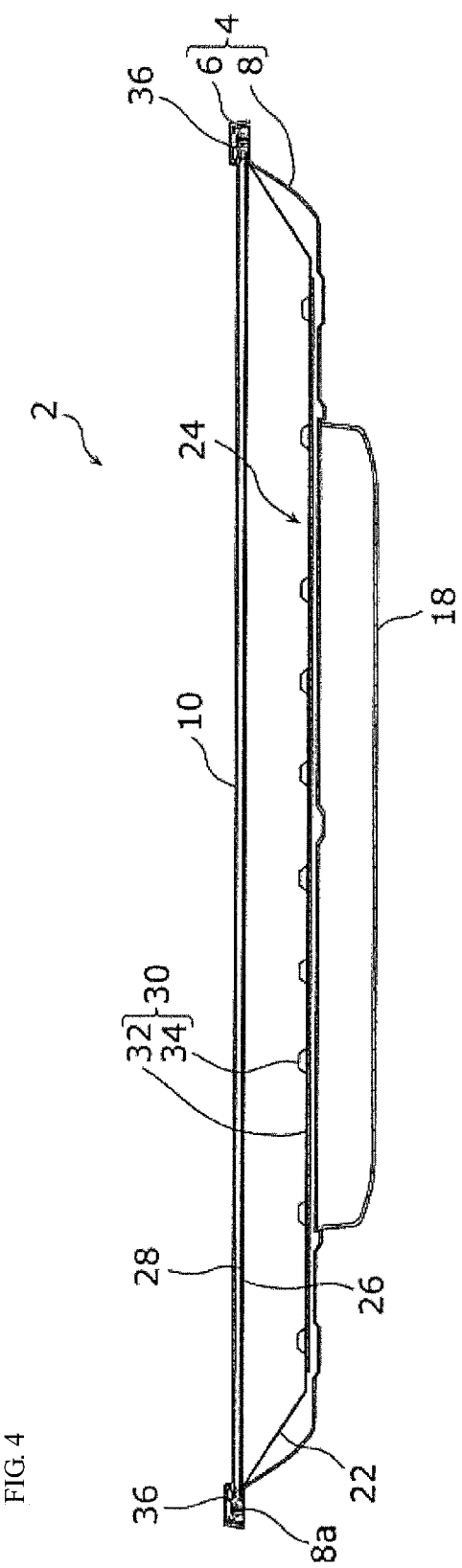
FIG. 4 is a cross-sectional view of the display device cut along the line A-A in FIG. 1.

First, an overall configuration of a display device according to one or more embodiments of a first example of the present invention will be described with reference to FIGS. 1 to 4. FIG. 1 is a perspective view illustrating a front surface side of the display device according to the first example. FIG. 2 is a perspective view illustrating a back surface side of the display device according to the first example. FIG. 3 is an exploded perspective view illustrating the back surface side of the display device according to the first example in a state where a rear cover is removed from a rear frame. FIG. 4 is a cross-sectional view of the display device cut along the line A-A in FIG. 1.

As illustrated in FIGS. 1 and 2, a display device 2 is a liquid crystal television receiver provided with an enclosure 4. The enclosure 4 is configured by a mutual combination of a front cabinet 6 and a back surface enclosure, e.g., rear frame 8.

The front cabinet 6 is configured in a frame shape and covers an outer periphery of a display panel, e.g., a liquid crystal cell 10, that will be described below. The front cabinet 6 is formed of, for example, resin.

A rear frame 8 is disposed so as to cover a back surface side of the liquid crystal cell 10. A rectangular flange portion 8a extending toward an outer side of the rear frame 8 is provided on an open portion of the rear frame 8. Moreover, a protrusion 8b for positioning a rear cover 18 that will be described below relative to the rear frame 8 is provided on the rear frame 8. This protrusion 8b extends along an outer periphery of the rear cover 18 and protrudes on a side opposite the liquid crystal cell 10. As illustrated in FIG. 3, a heat generating component, e.g., a power source substrate 12 (or other power source that generates heat), for supplying power to the liquid crystal cell 10 and the like is mounted with a plurality of screws 14 on a central portion of an outer surface (i.e., the side opposite the liquid crystal cell 10) of the rear frame 8. A plurality of electronic components 16 such as resistive elements, integrated circuits (IC), or the like is mounted on the power source substrate 12. Various types of substrates and the like (not illustrated) besides the power source substrate 12 are mounted on the outer surface of the rear frame 8. The rear frame 8 is formed of sheet metal such as steel that is electrically chromate coated (SECC; electrogalvanized steel) or the like.

As illustrated in FIGS. 2 and 3, a back surface enclosure, e.g., the rear cover 18, is mounted with fastening member, e.g., a screw or a plurality of screws 19, on the central portion of the outer surface of the rear frame 8. That is, the power substrate 12 is disposed between the rear cover 18 and the rear frame 8 (in other words, between the rear cover 18 and the liquid crystal cell 10). The outer periphery of the rear cover 18 contacting an inner periphery of the protrusion 8b positions the rear cover 18 relative to the rear frame 8. This rear cover 18 covers the power source substrate 12 and the like described above. A stand 20 for supporting the enclosure 4 from below is mounted on a lower end portion of the rear cover 18. The rear cover 18 and the stand 20 are each formed of, for example, resin. The rear cover 18 has a characteristic structure in the display device 2 of the present embodiment. The characteristic structure of the rear cover 18 will be described below.

As illustrated in FIG. 4, a reflective sheet 22, a backlight unit 24, a diffusion plate 26, an optical sheet 28, and the liquid crystal cell 10 are disposed inside the enclosure 4.

[Interior Structure of the Display Device]

Next, an interior structure of the display device 2 will be described with reference to FIG. 4. As illustrated in FIG. 4, the flange portion 8a of the rear frame 8 supports each outer periphery of the reflective sheet 22, the diffusion plate 26, and the optical sheet 28 described above.

The reflective sheet 22 is disposed so as to cover an inner surface of the rear frame 8 (i.e., a surface on a side on which the liquid crystal cell 10 is disposed). The reflective sheet 22 has a function of reflecting light from the backlight unit 24.

The backlight unit 24 is, for example, a backlight unit of a direct type method and irradiates light toward a back surface of the liquid crystal cell 10. The backlight unit 24 has a plurality of light-emitting diode (LED) bars 30. In FIG. 4, only one LED bar 30 is illustrated. Each of the plurality of LED bars 30 has a wiring substrate 32 and a plurality of LEDs 34 mounted on the wiring substrate 32. The wiring substrate 32 is configured in an elongated plate shape. The plurality of LEDs 34 is disposed at intervals in a row along a longitudinal direction of the wiring substrate 32. Double-sided tape having thermal conductivity (not illustrated) mounts the wiring substrate 32 on the inner surface of the rear frame 8. The wiring substrate 32 is formed of metal with high thermal conductivity, such as aluminum or the like.

The diffusion plate 26 is disposed between the backlight unit 24 and the liquid crystal cell 10. The diffusion plate 26 has a function of diffusing light from the backlight unit 24. The optical sheet 28 is disposed so as to cover a surface of the diffusion plate 26 on a liquid crystal cell 10 side. The optical sheet 28 has, for example, a function of guiding the light diffused by the diffusion plate 26 to the liquid crystal cell 10.

The liquid crystal cell 10 is configured in a rectangular panel shape. A frame-like cell guide 36 mounted on the flange portion 8a of the rear frame 8 supports the outer periphery of the liquid crystal cell 10. Irradiating the light from the backlight unit 24 on the back surface of the liquid crystal cell 10 displays an image on the liquid crystal cell 10.

[Structure of the Rear Cover According to One or More Embodiments]

Figure 5:
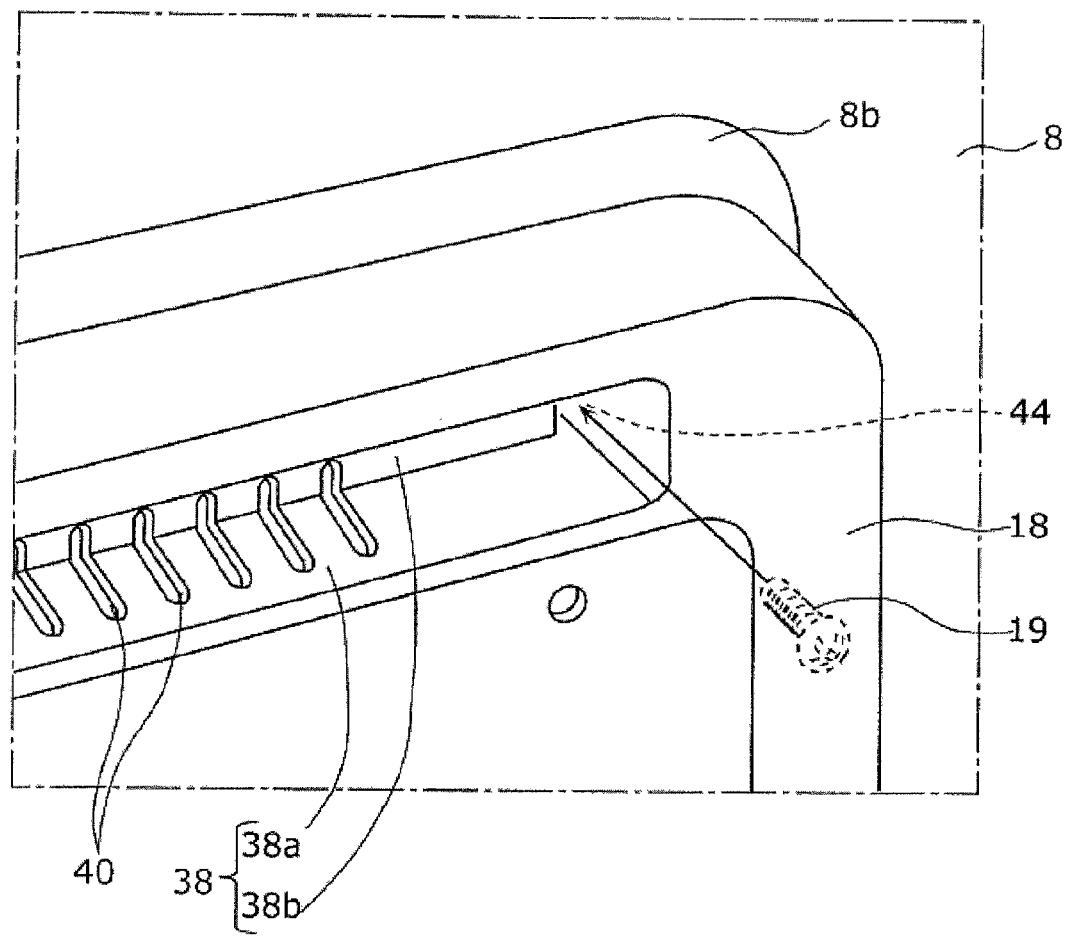
FIG. 5 is a partial perspective view illustrating an enlarged portion of a rear cover in FIG. 2.
Figure 6:
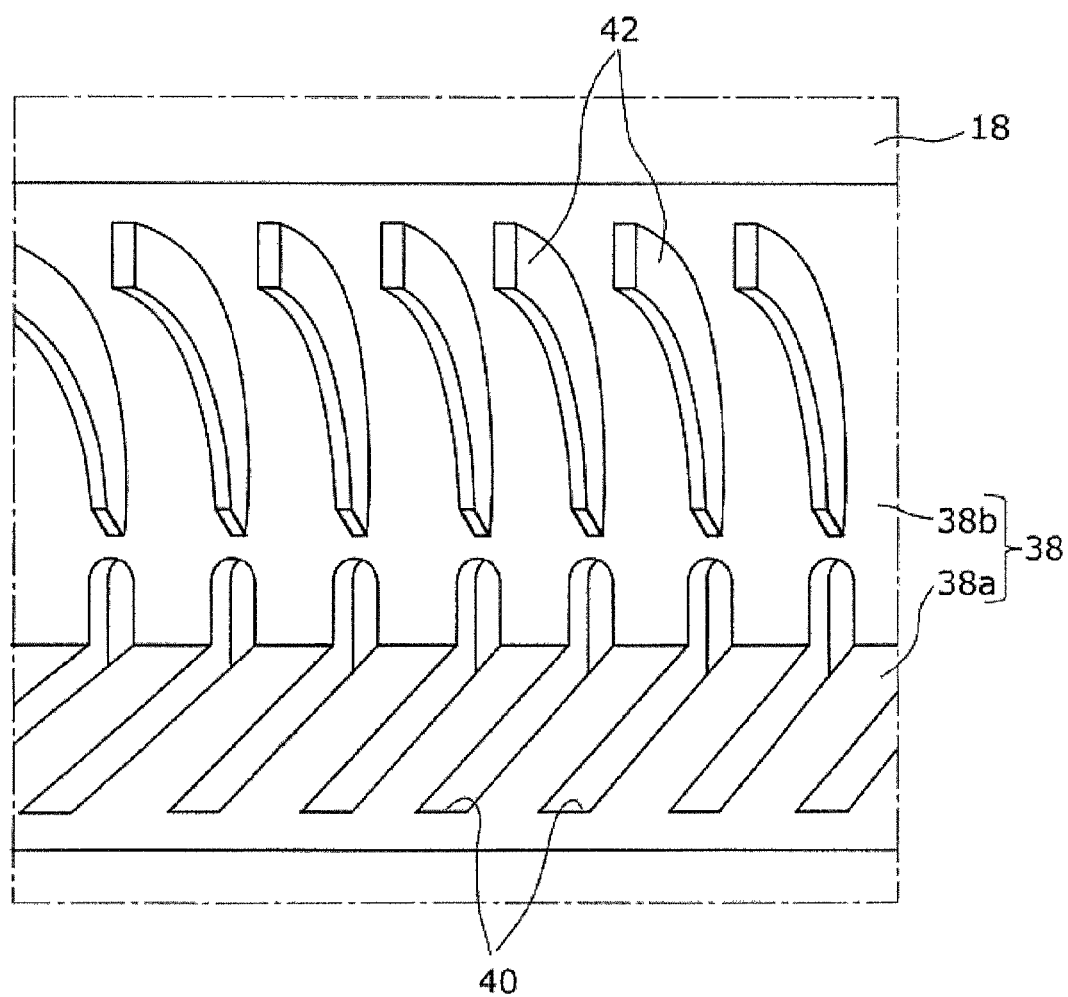
FIG. 6 is a partial perspective view illustrating an enlarged portion of a concave portion in FIG. 5.
Figure 7:
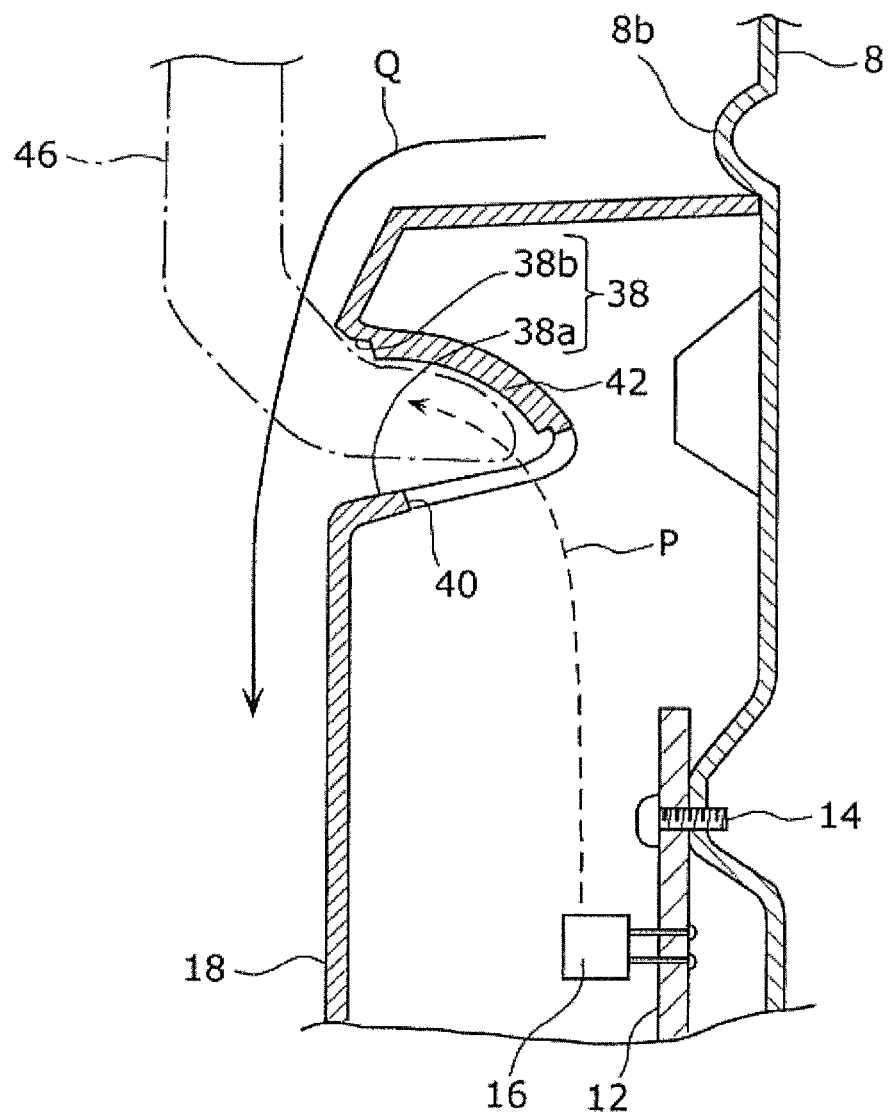
FIG. 7 is a partial cross-sectional view of the display device cut along the line B-B in FIG. 2.

Next, the characteristic structure of the rear cover 18 will be described with reference also to FIGS. 5 to 7. FIG. 5 is a partial perspective view illustrating an enlarged portion of the rear cover in FIG. 2. FIG. 6 is a partial perspective view illustrating an enlarged portion of a concave portion in FIG. 5. FIG. 7 is a partial cross-sectional view of the display device cut along the line B-B in FIG. 2.

As illustrated in FIGS. 2, 5, and 7, a concave portion 38 extending in an elongated shape in a lateral direction of the rear cover 18 (i.e., horizontal direction parallel to the longitudinal direction of the display device 2 in FIG. 2) is provided on an upper end portion of the rear cover 18. As illustrated in FIG. 7, this concave portion 38 is formed in a concave shape facing the liquid crystal cell 10 side. The concave portion 38 has a release portion 38a configuring a lower side portion of the concave portion 38 and a guide portion 38b configuring an upper side portion of the concave portion 38. The release portion 38a extends slightly obliquely upward toward the liquid crystal cell 10 side from the outer surface of the rear cover 18. The guide portion 38b is disposed on an upper side of the release portion 38a and extends slightly obliquely downward toward the liquid crystal cell 10 side from the outer surface of the rear cover 18. The release portion 38a and the guide portion 38b are disposed so as to oppose each other.

A plurality of holes 40 for releasing heat from the power source substrate 12 outside is provided on the release portion 38a. As illustrated in FIG. 6, each of the plurality of holes 40 is configured as a slit extending substantially vertically (i.e., perpendicular) relative to a longitudinal direction of the concave portion 38. The plurality of holes 40 is disposed at intervals in the longitudinal direction of the concave portion 38. As illustrated in FIGS. 6 and 7, one end portion of each of the plurality of holes 40 is disposed slightly more on the liquid crystal cell 10 side than a peripheral portion of an open portion of the concave portion 38. As illustrated in FIG. 7, the plurality of holes 40 is disposed on a side above the power source substrate 12.

As illustrated in FIGS. 6 and 7, a plurality of ribs 42 is provided on a top surface of the guide portion 38b. Each of the plurality of ribs 42 extends substantially vertically relative to the longitudinal direction of the concave portion 38. The plurality of ribs 42 is disposed at intervals in the longitudinal direction of the concave portion 38.

Furthermore, as illustrated in FIG. 5, a plurality of through holes 44 is provided on the concave portion 38. The plurality of through holes 44 is disposed at intervals in the longitudinal direction of the concave portion 38. The screw 19 is fastened to each of a plurality of screw holes (not illustrated) provided in the rear frame 8 through each of the plurality of through holes 44. The plurality of screws 19 thereby fastens the rear cover 18 to the rear frame 8.

When power is turned on for the display device 2, the power source substrate 12 is energized and generates heat. As illustrated by the arrow P of the dashed line in FIG. 7, the heat from the power source substrate 12 rises inside the rear cover 18 and is released from each of the plurality of holes 40. The heat from each of the plurality of holes 40 is released outside the display device 2 by being guided along the top surface of the guide portion 38b.

The concave portion 38 also functions as a handle. As illustrated in FIG. 7, the display device 2 can be carried and the like by hooking a fingertip 46 on the guide portion 38b of the concave portion 38 and lifting the display device 2.

[Effects According to One or More Embodiments]

Next, effects that can be obtained by the display device 2 according to one or more embodiments of the first example will be described. As described above, because the plurality of holes 40 is provided on the concave portion 38, the heat from the power substrate 12 can be released outside through the plurality of holes 40 and strength of the rear frame 8 can be secured. Cracks can thereby be suppressed from forming in the rear frame 8 when, for example, an object strikes the rear frame 8.

Furthermore, when liquid from, for example, a beverage or the like spills on a top surface of the enclosure 4, the liquid flows downward along the outer surface of the rear cover 18, as illustrated by the arrow Q of the solid line in FIG. 7. At this time, the liquid can be suppressed from flowing into each of the plurality of holes 40 because the plurality of holes 40 is provided on the concave portion 38.

Furthermore, as described above, because the plurality of ribs 42 is provided on the top surface of the guide portion 38*b*, the fingertip 46 is less likely to slip on the top surface of the guide portion 38*b* when hooking the fingertip 46 on the guide portion 38*b*. By this, the fingertip 46 can easily grip the guide portion 38*b* and the display device 2 can easily be carried and the like.

Furthermore, as described above, because the plurality of screws 19 for mounting the rear cover 18 on the rear frame 8 is disposed on the concave portion 38, a head of each of the plurality of screws 19 is less likely to appear on an external appearance of the display device 2. A design of the display device 2 can thereby be improved.

Second Example

Figure 8:
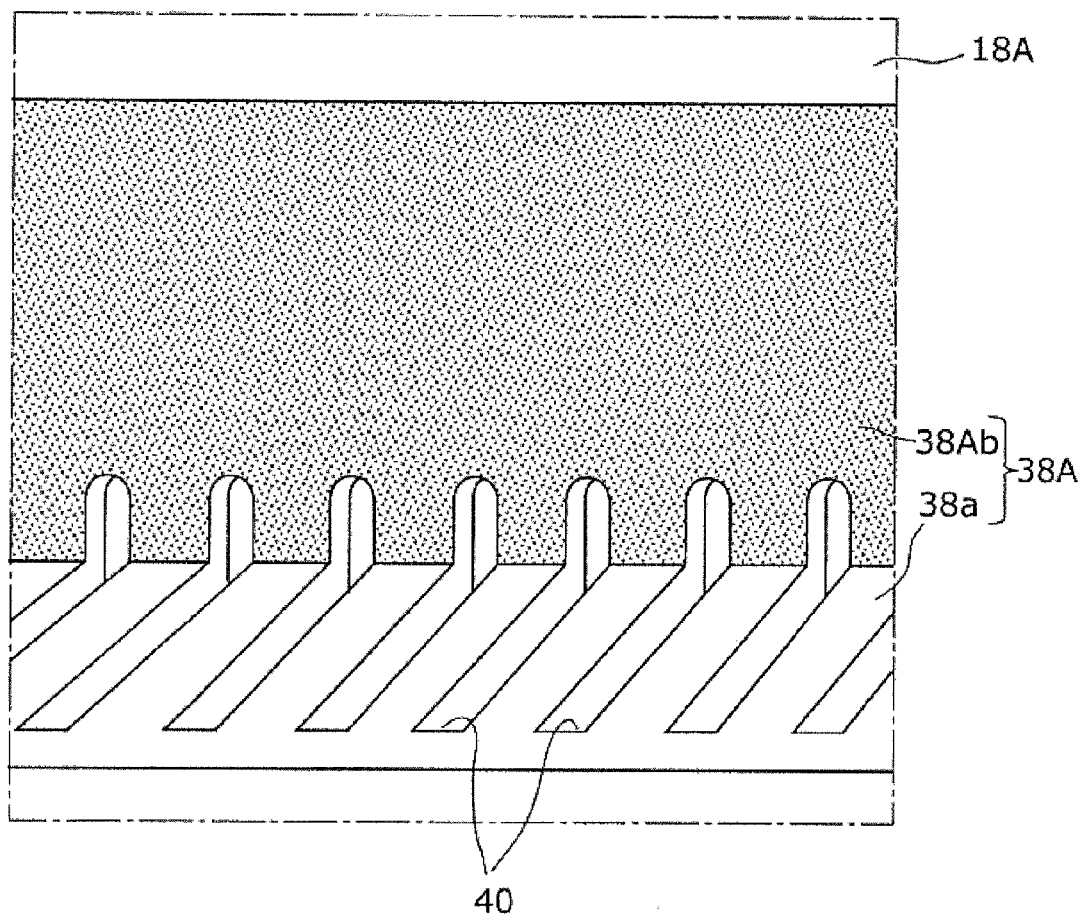
FIG. 8 is a partial perspective view illustrating an enlarged portion of a concave portion of a display device according to one or more embodiments of a second example of the present invention.

Next, a configuration of a display device according to one or more embodiments of a second example of the present invention will be described with reference to FIG. 8. FIG. 8 is a partial perspective view illustrating an enlarged portion of a concave portion of the display device according to the second example. In each embodiment below, the same reference numerals will be attached to the same or similar components as those in the first example described above, and explanations thereof will be omitted.

As illustrated in FIG. 8, a grain finish is applied on a top surface of a guide portion 38Ab of a concave portion 38A in a rear cover 18A of one or more embodiments of the second example. The halftone pattern in FIG. 8 represents the top surface of the guide portion 38Ab with the grain finish applied. The plurality of ribs 42 described in the above example is not provided on the top surface of the guide portion 38Ab. Even in a configuration such as that of one or more embodiments of the second example, an effect of being able to easily grip the guide portion 38Ab with a fingertip 46 (see FIG. 7) can be obtained in the same manner as in the first example described above.

Third Example

Figure 9:
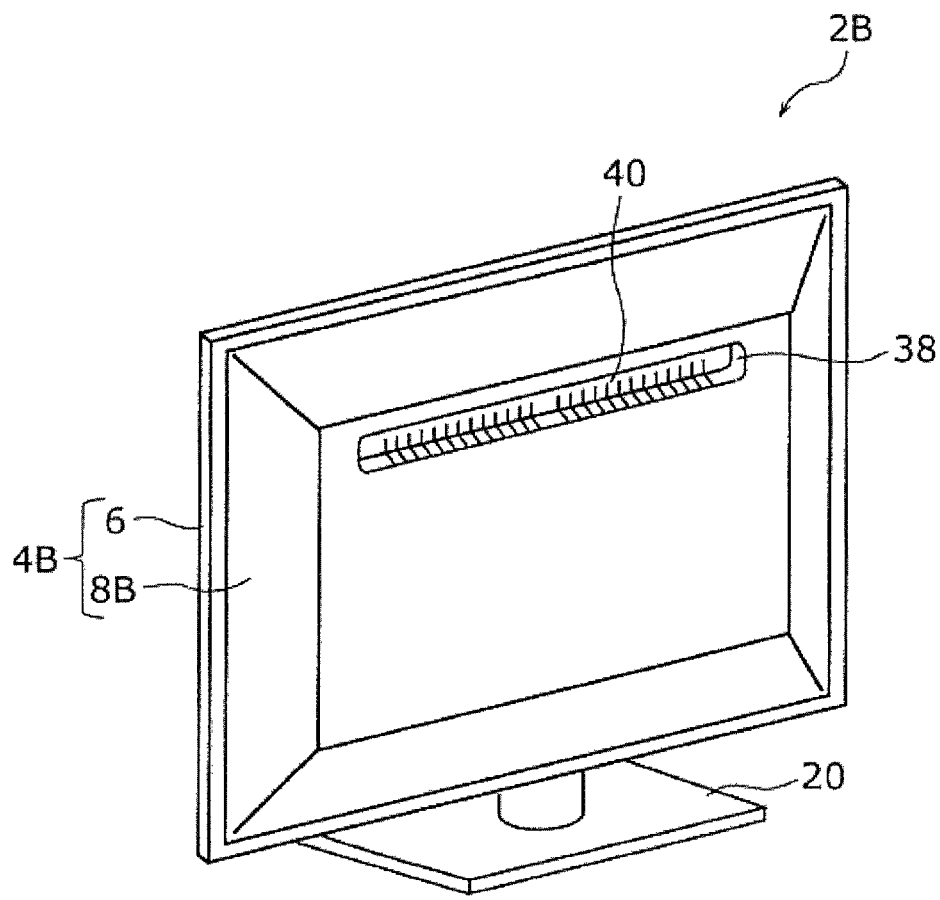
FIG. 9 is a perspective view illustrating a back surface side of a display device according to one or more embodiments of a third example of the present invention.

Next, a configuration of a display device according to one or more embodiments of a third example of the present invention will be described with reference to FIG. 9. FIG. 9 is a perspective view illustrating a back surface side of the display device according to the third example.

As illustrated in FIG. 9, the rear cover 18 described in the first example described above is not mounted on a rear frame 8B of an enclosure 4B in a display device 2B of one or more embodiments of the third example. A concave portion 38 is provided at a position slightly below an upper end portion of the rear frame 8B. The same or similar effects as the first example described above can be obtained even in this type of configuration.

The display device according to one or more embodiments of the first to third examples of the present invention is described above, but the present invention is not limited to these examples. For example, one or more embodiments of the examples described above may be respectively combined.

In the examples described above, a case where the display device is the liquid crystal television receiver is described, but other than the liquid crystal television receiver, the display device may be, for example, a liquid crystal monitor or the like for a personal computer.

In each example described above, only one concave portion is provided on the rear cover or the rear frame, but a plurality of concave portions can also be provided. The plurality of concave portions is disposed, for example, at intervals in the lateral direction of the back surface enclosure but may be provided in a longitudinal direction in other embodiments depending on the location and/or shape of the power source substrate.

The display device of one or more embodiments of the present invention is applicable, for example, as a liquid crystal television receiver or the like.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

EXPLANATION OF REFERENCE NUMERALS 2, 2B Display device
4, 4B Enclosure
6 Front cabinet
8, 8B Rear frame
10 Liquid crystal cell
12 Power source substrate
14, 19 Screw
16 Electronic component
18, 18A Rear cover
20 Stand
22 Reflective sheet
24 Backlight unit
26 Diffusion plate
28 Optical sheet
30 LED bar
32 Wiring substrate
34 LED
36 Cell guide
38, 38A Concave portion
38*a* Release portion
38*b*, 38Ab Guide portion
40 Hole
42 Rib
44 Through hole
46 Fingertip

What is claimed is:
1. A display device, comprising:
a display panel;
a back surface enclosure disposed on a back surface side of the display panel and comprising a concave portion formed in a concave shape that is recessed to a display panel side in a cross-section orthogonal to a lateral direction of the back surface enclosure; and a heat generating component disposed between the display panel and the back surface enclosure, wherein the concave portion comprises a plurality of holes that release heat from the heat generating component to an outside of the display device.

2. The display device according to claim 1, wherein the plurality of holes is disposed above the heat generating component in a longitudinal direction of the back surface enclosure.

3. The display device according to claim 2, wherein the concave portion comprises:

an release portion comprising the plurality of holes; and a guide portion that guides heat from the plurality of holes to an outside of the display device and is disposed above the release portion in a longitudinal direction of the back surface enclosure.

4. The display device according to claim 2, wherein the back surface enclosure comprises:

a rear frame disposed on the back surface side of the display panel; and a rear cover that covers a portion of an outer surface of the rear frame, wherein the heat generating component is disposed between the rear frame and the rear cover, and the concave portion is provided on the rear cover.

5. The display device according to claim 1, wherein the concave portion comprises:

a release portion comprising the plurality of holes; and a guide portion that guides heat from the plurality of holes to an outside of the display device and is disposed above the release portion in a longitudinal direction of the back surface enclosure.

6. The display device according to claim 5, wherein the back surface enclosure comprises:

a rear frame disposed on the back surface side of the display panel; and a rear cover that covers a portion of an outer surface of the rear frame, wherein the heat generating component is disposed between the rear frame and the rear cover, and the concave portion is provided on the rear cover.

7. The display device according to claim 5, wherein the release portion is disposed opposite the guide portion.

8. The display device according to claim 7, wherein the concave portion extends in an elongated shape in a lateral direction of the back surface enclosure, the plurality of holes is disposed at intervals in a longitudinal direction of the concave portion; and each of the plurality of holes extends in a direction substantially perpendicular to the longitudinal direction of the concave portion.

9. The display device according to claim 7, wherein the guide portion comprises a plurality of ribs on a top surface of the guide portion.

10. The display device according to claim 7, wherein a grain finish is applied to a top surface of the guide portion.

11. The display device according to claim 7, wherein the back surface enclosure comprises:

a rear frame disposed on the back surface side of the display panel; and a rear cover that covers a portion of an outer surface of the rear frame, wherein the heat generating component is disposed between the rear frame and the rear cover, and the concave portion is provided on the rear cover.

12. The display device according to claim 5, wherein the concave portion extends in an elongated shape in the lateral direction of the back surface enclosure, the plurality of holes is disposed at intervals in a longitudinal direction of the concave portion; and each of the plurality of holes extends in a direction substantially perpendicular to the longitudinal direction of the concave portion.

13. The display device according to claim 12, wherein the guide portion comprises a plurality of ribs on a top surface of the guide portion.

14. The display device according to claim 12, wherein a grain finish is applied to a top surface of the guide portion.

15. The display device according to claim 12, wherein the back surface enclosure comprises:

a rear frame disposed on the back surface side of the display panel; and a rear cover that covers a portion of an outer surface of the rear frame, wherein the heat generating component is disposed between the rear frame and the rear cover, and the concave portion is provided on the rear cover.

16. The display device according to claim 5, wherein the guide portion comprises a plurality of ribs on a top surface of the guide portion.

17. The display device according to claim 16, wherein the back surface enclosure comprises:

a rear frame disposed on the back surface side of the display panel; and a rear cover that covers a portion of an outer surface of the rear frame, wherein the heat generating component is disposed between the rear frame and the rear cover, and the concave portion is provided on the rear cover.

18. The display device according to claim 5, wherein a grain finish is applied to a top surface of the guide portion.

19. The display device according to claim 1, wherein the back surface enclosure comprises:

a rear frame disposed on the back surface side of the display panel; and a rear cover that covers a portion of an outer surface of the rear frame, wherein the heat generating component is disposed between the rear frame and the rear cover, and the concave portion is provided on the rear cover.

20. The display device according to claim 19, further comprising a fastening member that fastens the rear cover to the rear frame and is disposed on the concave portion.

* * * * *